United States Patent [19]
Kojima

[11] Patent Number: 5,130,646
[45] Date of Patent: Jul. 14, 1992

[54] CIRCUIT FOR CONNECTING SEQUENTIALLY A PLURALITY OF DEVICES TO BE TESTED TO A TESTER APPARATUS

[75] Inventor: Eiji Kojima, Tokyo, Japan

[73] Assignee: Ando Electric Co., Ltd., Tokyo, Japan

[21] Appl. No.: 619,165

[22] Filed: Nov. 27, 1990

[30] Foreign Application Priority Data

Nov. 30, 1989 [JP] Japan ................... 1-311635

[51] Int. Cl.$^5$ ........................................... G01R 31/28
[52] U.S. Cl. ..................... 324/158 R; 324/73.1; 371/15.1; 371/22.3
[58] Field of Search ............. 324/73.1, 158 R; 371/15.1–25.1; 364/681, 551.01; 437/8

[56] References Cited

U.S. PATENT DOCUMENTS

| | | | |
|---|---|---|---|
| 4,354,268 | 10/1982 | Michel et al. | 371/15.1 |
| 4,583,223 | 4/1986 | Inoue et al. | 324/73.1 |
| 4,928,278 | 5/1990 | Otsuji et al. | 371/1 |
| 4,931,723 | 6/1990 | Jeffrey et al. | 324/73.1 |

*Primary Examiner*—Vinh Nguyen
*Attorney, Agent, or Firm*—Seidel, Gonda, Lavorgan & Monaco

[57] ABSTRACT

A circuit for connecting sequentially a plurality of devices to be tested to a test apparatus. The circuit is of a structure which allows one device to be connected to the test apparatus at one time. The circuit includes a scanner for scanning the devices under test. The includes a shift register which performs shift operation in response to a scan command signal, AND circuits each having one input to which an output of the shift register is applied and the other input to which a signal indicating presence or absence of the associated device under test is applied, and a NOR circuit having inputs supplied with the outputs of the AND circuits, respectively. Further, the circuit includes NAND circuits each having one input to which the output of the corresponding one of the AND circuits is applied and the other input to which a pin card relay drive signal is applied. Still further, a binary coded decimal (BCD) conversion ROM is included to which the output of the NOR circuit is applied as an enable signal are provided. A relay incorporated in each of pin cards provided in association with the devices under test is driven by the output of the corresponding one of the NAND circuits to connect the corresponding device under test to a measuring apparatus. IC device test apparatus can be realized inexpensively with a simple structure.

2 Claims, 3 Drawing Sheets

CIRCUIT FOR CONNECTING SEQUENTIALLY A PLURALITY OF DEVICES TO BE TESTED TO A TESTER APPARATUS

BACKGROUND OF THE INVENTION

1. Field of the Invention

The present invention relates generally to an apparatus for testing electronic devices such as IC memory devices. More particularly, the invention is concerned with a circuit for connecting sequentially a plurality of devices under test to a single measuring apparatus or a tester. The present invention can profitably be applied to the test of integrated circuit (IC) memory devices by resorting to a directed current or DC measurement.

2. Description of the Prior Art

For having a better understanding of the present invention, description will first be made of a structure of the prior art circuit by reference to FIG. 3 of the accompanying drawings.

In FIG. 3, a reference symbol 1A denotes an oscillator, 1B denotes a start flip-flop circuit, 1C denotes a NOR circuit, 1D denotes a stop flip-flop circuit, 1E denotes a NOR circuit, 1F denotes a pin-end flag flip-flop circuit, 1G denotes a scanning counter, 2A to 2D denote, respectively, ROMs (read-only memories) for binary coded decimal conversion, 3A to 3D denotes registers, respectively, 4A to 4D denote NOR circuits, respectively, 7 denotes a DC measuring apparatus, 8A to 8D denote pin cards, respectively, 9A to 9D denote, respectively, devices under test (also referred to as the device to be tested or DUT in abbreviation), 10A to 10D denote inverter circuits, respectively, and finally a reference numeral 11 denotes an OR circuit.

In the case of the example shown in FIG. 3, it is assumed that each of the devices under test or DUTs 9A to 9D is provided with 32 pins, wherein the pins for measurement of the DUTs 9A to 9D are classified into four groups, as mentioned below.

For the DUT 9A, 1st to 32nd pins.
For the DUT 9B, 33rd to 64th pins.
For the DUT 9C, 65th to 96th pins.
For the DUT 9D, 97th to 128th pins.

Pin data for the measurement of the DUTs which are transferred from a central processing unit or CPU (not shown) are stored in the registers 3A to 3D, respectively, in such a manner as mentioned below.

(a) Data of the 1st to 8th pins used for the test or measurement of the DUT 9A are stored in the register 3A.

(b) Data of the 33rd to 40th pins for the measurement of the DUT 9B are stored in the register 3B.

(c) Data of the 65th to 72nd pins for the measurement of the DUT 9C are stored in the register 3C.

(d) Data of the 97th to 104th pins for the measurement of the DUT 9D are stored in the register 3D.

The ROMs 2A to 2D are loaded with data for the binary conversion or BCD conversion.

Operation for measuring or testing the DUTs is usually carried out in a manner described below.

At first, a start signal is supplied from the central processing unit or CPU. In response thereto, the start flip-flop circuit 1B is set, whereon the scanning counter 1G is activated to start counting the pulses generated by the oscillation circuit 1A.

The binary coded decimal conversion (BCD) ROMs 2A to 2D generate output scanning data for the 1st to 128th pins in response to the outputs of the scanning counter 1G, respectively. Assuming now that the scanning data is for the 1st pin, coincidence is then found with the output data of the register 3A, whereby the stop flip-flop circuit 1D is set through the NOR circuit 4A and the OR circuit 11, as a result of which the start flip-flop circuit 1D is reset. Thus, the scanning counter 1G is caused to stop the counting operation temporarily. In this state, an associated relay incorporated in the pin card 8A is turned on, resulting in that the device under test or DUT 9A is connected to the DC measuring apparatus 7 which then starts the measurement of a direct current or DC. Upon completion of the measurement performed by the DC measuring apparatus 7, the scanning counter 1G again starts the counting operation in response to the start signal 21 supplied from the CPU. In this manner, measurement is performed sequentially for the 2nd to 8th pins through the similar processes.

In succession to completion of the abovementioned measurement, the scanning counter 1G starts once again the counting operation for the measurement via the 9th to 32nd pins in response to the start signal 21 supplied from the CPU. At this time, however, the registers 3A to 3D store no data for the 9th to 32nd pins, as mentioned hereinbefore in conjunction with the distributed data storage among the registers 3A to 3D. Consequently, no coincidence is established with the scanning data held in the binary coded decimal (BCD) conversion ROMs 2A to 2D, which results in that the scanning counter 1G proceeds up to the 33rd pin to stop thereat temporarily for performing the measurement via that pin.

In this manner, on the assumption made hereinbefore in conjunction with the distributed data storage among the registers 3A to 3D, measurements can be subsequently performed via the 34th to 40th pins, 65th to 72nd pins and the 97th to 104th pins, respectively.

For the 105th to 128th pins, no scanning data are contained in the registers 3A to 3D on the assumption made hereinbefore. Consequently, the scanning counter 1G continues the counting operation until a carry is generated, whereupon the pin-end flag flip-flop circuit 1F is set with the scanning counter 1G stopping the counting operation, while a pin-end flag 22 is set. The CPU detects the pin-end flag to recognize that the measurement has been completed for all the pins. Thus, the whole test or measurement sequence comes to an end.

SUMMARY OF THE INVENTION

As will be understood form the above description, in the case of the prior art IC device testing apparatus, there are required as many ROMs (2A, ..., 2D), registers (3A, ..., 3D) and NOR circuit (4A, ..., 4D) as the devices to be tested, which makes the circuit implementation not only very expensive but also more complicated, to a problem, which will become more serious as the number of pins provided for the device to be tested increases, as expected in the not distant future.

It is therefore an object of the present invention to provide an apparatus for testing a plurality of electronic devices, which apparatus can avoid the disadvantages of the prior art apparatus described above.

In view of the above and other objects which will be more apparent as description proceeds, there is provided according to an aspect of the present invention a circuit arrangement for connecting sequentially a plurality of devices to be tested to a test apparatus, which arrangement comprises a circuitry for scanning the devices to be tested, said circuitry including a shift register which performs shift operation in response to a scan command signal, AND circuits each having one input to which an output of the shift register is applied and the other input to which a signal indicating presence or absence of the device under test is applied, and a NOR circuit having inputs supplied with the outputs of the AND circuits, respectively, NAND circuits each having one input to which the output of the corresponding one of the AND circuits is applied and the other input to which a pin card relay drive signal is applied, and a binary coded decimal conversion ROM to which the output of the NOR circuit is applied as an enable signal, wherein a relay incorporated in each of pin cards provided in association with the device under test is driven by the output of the corresponding one of the NAND gates.

With the arrangement described above, it is possible to test any given number of devices or DUTs with a simple and inexpensive circuit structure which substantially corresponds to that required for measuring one DUT in the prior art test apparatus described hereinbefore, to a great advantage.

The present invention is characterized by the features described below:

(1) For coping with the measurement of a great number of the DUTs, all the pins for measurement are not classified discriminatively into the groups as mentioned hereinbefore in conjunction with the prior art apparatus shown in FIG. 3, but grouped into sets which can be used in common for measurement of given devices to be tested. (This feature will be referred to as the common pin DUT multiplexed measurement scheme). More specifically, let's assume, by way of example, that the number of pins is 128. In that case, all the pins are grouped arbitrarily into four sets each including 32 pins, wherein devices to be tested are connected to the pin sets, respectively, in an arbitrary manner.

(2) The scanning counter, the binary coded decimal (BCD) conversion ROM and the pin register may be provided each in a number which allows only one DUT to be measured.

(3) For performing the test for all the DUTs, measurement for one DUT is repeated for a number of times which corresponds to the number of pin sets.

The above and other objects, novel features and advantages of the present invention will be more apparent upon reading the following description taken in conjunction with a preferred embodiment thereof by reference to the accompanying drawings.

DETAILED DESCRIPTION OF THE PREFERRED EMBODIMENTS

Now, the present invention will be described in detail in conjunction with an exemplary or preferred embodiment thereof by reference to FIGS. 1 and 2.

Figure 1:
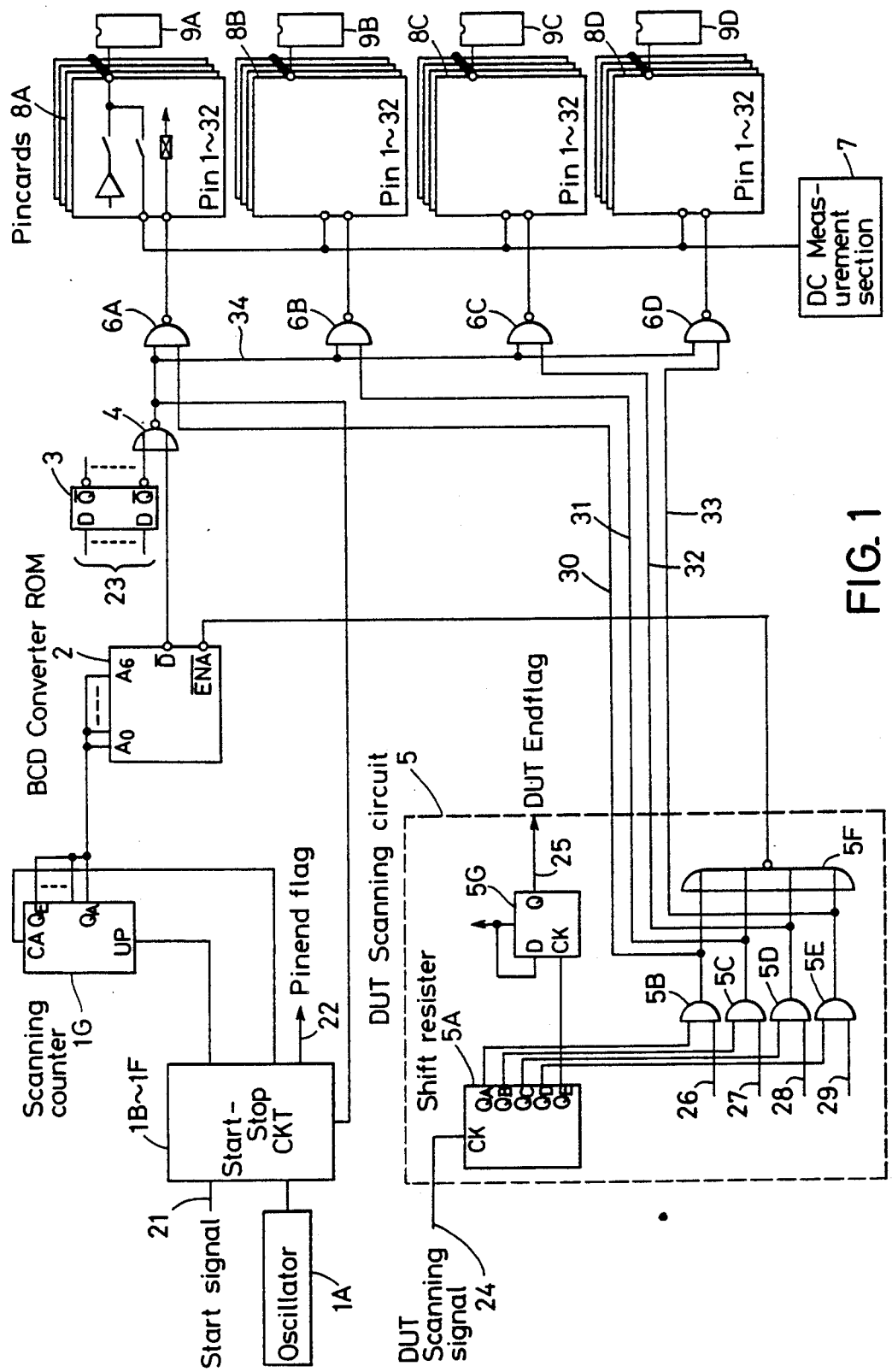
FIG. 1 is a schematic circuit diagram showing a general arrangement of a circuit for connecting sequentially a plurality of devices under test to a single measuring apparatus according to an embodiment of the present invention.

FIG. 1 shows in a block diagram a configuration of the circuit for connecting sequentially devices under test or DUTs to a DC measuring apparatus according to an embodiment of the present invention. In this figure, a reference character 2 denotes a ROM (read-only memory) for binary coded decimal conversion, 3 denotes a register, 4 denotes a NOR circuit, 5 denotes a DUT scanning circuit, 5A denotes a shift register, 5B to 5E denote AND circuits, respectively, 5F denotes a NOR circuit, 5G denotes a DUT end flag flip-flop circuit and 6A to 6D denote NAND circuits, respectively. In FIG. 1, same components or elements as those shown in FIG. 3 are denoted by same reference characters as those used in FIG. 3.

Figure 3:
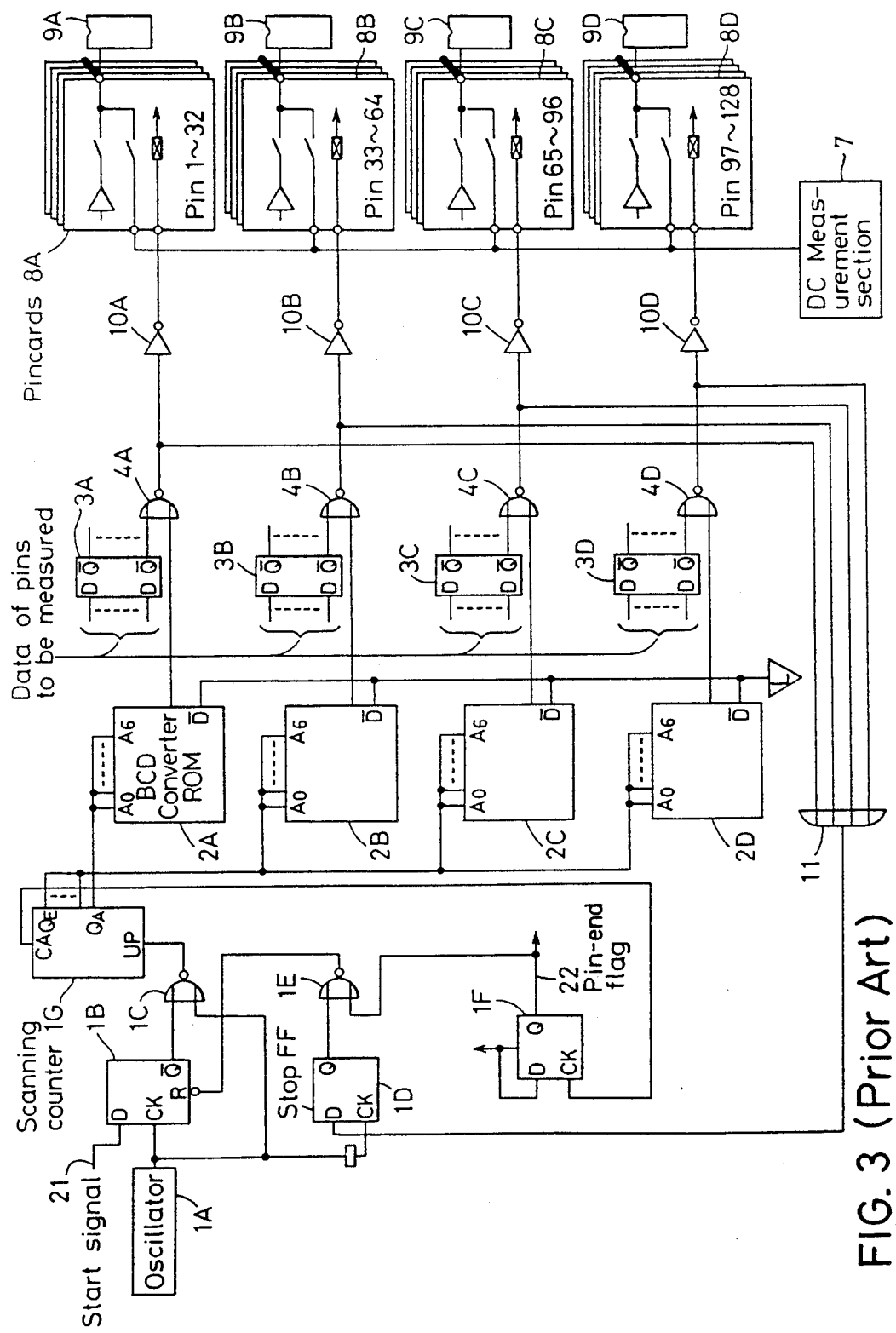
FIG. 3 is a circuit diagram showing schematically a structure of the apparatus for testing IC devices known heretofore.

More specifically, in the circuit arrangement shown in FIG. 1, there are employed the oscillator 1A, the start flip-flop circuit 1B, the NOR circuit 1C, the stop flip-flop circuit 1D, the NOR circuit 1E, the pin-end flag flip-flop circuit 1F and the scanning counter 1G, as in the case of the circuit shown in FIG. 3. On the other hand, the four binary coded decimal (BCD) conversion ROMs 2A to 2D shown in FIG. 3 are replaced by the single BCD conversion ROM 2 shown in FIG. 1. Besides, instead of the registers 3A to 3D shown in FIG. 3, the single register 3 is employed in the case of the circuit shown in FIG. 1. Further, the NOR circuits 4A to 4D shown in FIG. 3 are substituted for by the NOR circuit 4. Additionally, the inverter circuits 10A to 10D shown in FIG. 3 are replaced by the NAND circuits 6A to 6D, respectively, in the arrangement shown in FIG. 1, while the OR circuit 11 shown in FIG. 3 is replaced by the circuit 5 for scanning the device under test or DUTs.

The DUT scanning circuit 5 is constituted by a shift register 5A, AND circuits 5B to 5E, a NOR circuit 5F and a DUT end flag flip-flop circuit 5G.

As will readily be appreciated from the above, although there are required the four BCD conversion ROMs 2A to 2D, the registers 3A to 3D and the NOR circuits 4A to 4D in one-to-one correspondence to the DUTs, respectively, in the case of the prior art circuit shown in FIG. 3, the circuit arrangement according to the present invention shown in FIG. 1 requires only one binary coded decimal (BCD) conversion ROM 2, one register 3 and one NOR circuit 4.

The register 3 stores therein the data for the measurement via the 1st to 8th pins.

The AND circuit 5B has one input to which a signal 26 indicating the presence of a device 9A under test is applied. Hereinafter, the signal indicating the presence of the device under test or DUT will also be referred to as the DUT presence signal 26. The AND circuit 5C has one input supplied with a DUT presence signal 27 corresponding to the DUT 9B. Further, the AND circuit 5D has one input supplied with a DUT presence signal 28 corresponding to the DUT 9C, while the AND circuit 5E has one input supplied with DUT presence signal 29 corresponding to a DUT 9D.

The first DUT scanning signal 24 is issued by a central processing unit or CPU (not shown).

In response to the DUT scanning signal 24, shift operation takes place in the register 5A, whereby a signal of a high level "H" makes appearance at the output terminal $Q_A$ of the shift register 5A while a low signal of a level "L" is produced at the output terminals $Q_B$ and $Q_C$. As a result, the binary coded decimal conversion ROM 2 is set to the enabled state by way of the AND circuit 5B and the NOR circuit 5F.

Subsequently, in response to the start signal 21 issued by the CPU, the state ready to perform the measurement via the 1st pin is established through the similar process described hereinbefore in conjunction with the prior art apparatus. In this state, only the output signal 30 of the AND circuit 5B is at "H" level. Consequently, only the relay that is incorporated in the pin card 8A is turned on in response to a pin card relay drive signal 34 extracted from the output of the NOR circuit 4, as a result of which only the DUT 9A is connected to the DC measuring apparatus 7.

Upon completion of the measurement of the DUT 9A by the DC measuring apparatus 7, measurement of the DUT 9B is performed via the 2nd to 8th pins sequentially, as described hereinbefore by reference to FIG. 3. Thereafter, a pin end flag 22 is set by each of the start/stop circuits 1B to 1F. The pin end flag 22 is detected by the CPU which then recognizes that the measurement for the DUT 9A has been completed. Subsequently, a second DUT scanning signal 24 is issued by the CPU in order to perform the measurement for the DUT 9B, which causes the shift register 5A to shift by one bit. Consequently, only the output terminal $Q_B$ is at the level "H" with only the signal 31 of the AND gate 5C being at "H". Thus, the BCD conversion ROM 2 is set to the enabled state by way of AND circuit 5C and NOR circuit 5F. In this state, measurement can be performed for the DUT 9B in response to the start signal 21 supplied from the CPU, as in the case of the measurement for the DUT 9A.

Next, the CPU issues a third DUT scanning signal 24 in order to perform the measurement for the DUT 9C, which results in that the level "H" makes appearance only at the output terminal $Q_C$ of the shift register 5A, while the DUT presence signal 28 is set to "L". Consequently, the binary code data conversion ROM 2 is disabled. In this state, the counting operation of the scanning counter 1G started in response to the start signal 21 supplied from the CPU can not cause the BCD conversion ROM 2 to output the scanning data.

Thus, the pin card relay drive signal 34 is inhibited from being outputted from the NOR circuit 4, which in turn means that the relay incorporated in the pin card 8C is not turned on. Consequently, the DUT 9C is not connected to the DC measuring apparatus 7. In other words, the pin end state is established in which no measurement for the DUT can be carried out.

Now, the measurement is performed for the DUT 9D in response to a fourth DUT scanning signal 24 in the manner similar to the measurements of the DUTs 9A and 9B. After the pin end state has been established for the DUT 9D, a fifth DUT scanning signal 24 is issued by the CPU. The measurement for the DUT 9D is performed in the same manner as described above. Upon completion of the measurement or test, the DUT end flag flip-flop circuit 5G is set, being accompanied with the setting of the DUT end flag 25. The CPU thus recognizes that the sequential measurements for all the DUTs have been completed. Thus, a series of sequential DUT tests comes to an end.

Now, operation of the apparatus shown in FIG. 1 will be described in more detail by reference to a timing chart shown in FIG. 2.

Figure 2:
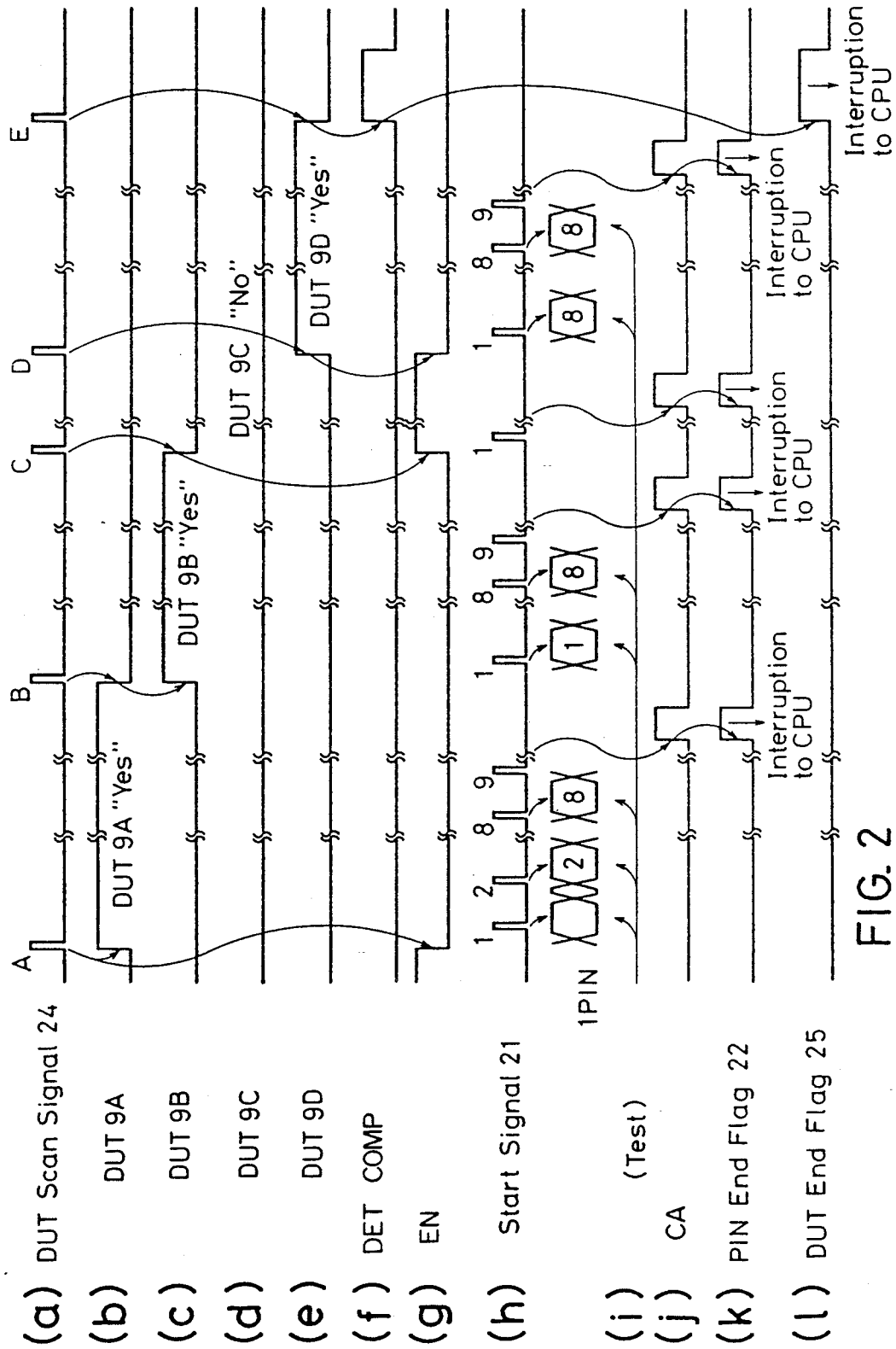
FIG. 2 is a timing diagram for illustrating operations of the circuit shown in FIG. 1.

The DUT scanning signal 24 is of such a waveform as shown at (a) in FIG. 2. The DUT scanning signal 24 serves to detect the presence of the device under test or DUT and is issued by the CPU in precedence to the start of test or measurement for the individual DUTs. In the DUT scanning signal 24, a pulse E represents the detection of the completion of measurements for all the DUTs.

Referring to FIG. 2 at (b), there is shown a signal waveform for the measurement or test of the DUT 9A. This signal is produced by logically ANDing the signal 26 and the output signal from the terminal $Q_A$ of the DUT scanning shift register 5A, in a manner as previously described with referent to FIG. 1.

A signal waveform for the measurement of the DUT 9B is shown at (c) in FIG. 2. This signal is derived as a logical product of the signal 27 and the output signal appearing at the terminal $Q_B$ of the DUT scanning shift register 5A (see FIG. 1).

A signal waveform for the measurement of the DUT 9C is shown at (d) in FIG. 2. It can be seen that this signal remains constant throughout the whole period, indicating the absence of the DUT 9C.

A signal waveform for the measurement of the DUT 9D is shown at (e) in FIG. 2. This signal is produced by logically ANDing the signal 29 and the output signal from the terminal Q of the shift register 5A (see FIG. 1).

Shown at (f) in FIG. 2 is a signal (Det Comp) representing the detection of completion of the measurements for all the DUTs. This signal assumes a high or "H" level upon completion of the measurements for all the DUTs.

There is shown at (g) in FIG. 2 a waveform (EN) of the output signal of the NOR circuit 5F shown in FIG. 1 which serves for enabling the binary coded decimal conversion ROM2.

Shown at (h) in FIG. 2 is a waveform of the start signal 21 which is issued by the CPU in precedence to the start of each test or measurement to serve for detecting the pins to be tested in each of the DUT. In response to this start signal 21, the scanning counter 1G, by way of circuits 1B–1F, starts the counting operation, whereon the output of the register 3 (FIG. 1) and the output of the binary code data conversion ROM 2 are logically NORed through the NOR circuit 4. Operation of the scanning counter 1G of FIG. 2(h) is then stopped to allow the state to be established in which measurement can be performed for one pin.

Shown at (i) (test) in FIG. 2 are the states of the pins under test FIG. 2(i) is also related to FIG. 2(h).

Referring to waveforms shown in FIG. 2 at (j) and (k), respectively, it can be seen that in response to the carry output CA FIG. 2(j) of the scanning counter 1G which indicates completion of the tests or measurements for all the pins, the pin end flip-flop 1F is set with the pin end flag 22 FIG. 2(k) being set, whereon interrupt is made to the CPU. Thus, the CPU is capable of detecting the completion of measurements for all the pins of each DUT.

Shown in FIG. 2 at (1) is a waveform of the DUT end flag 25. Upon completion of the measurements for all the DUTs, the DUT end flag 25 is set to allow interrupt to be made to the CPU, which then detects completion of the measurements of all the DUTs.

Thus, after the measurement for the DUT 9D has been completed, the signal shown at (f) in FIG. 2 assumes the "H" level to thereby set, by way of shift register 5A, the DUT end flip-flop 5G with the DUT end flag being set thereby.

As will be appreciated from the foregoing description, by virtue of the so-called common pin multiplexed DUT measuring scheme taught by the invention, it is possible to perform the measurements for a given number of the DUTs with an amount of hardware which substantially corresponds to that required for the measurement of a single DUT. In this manner, the number of the scanning counters, the BCD conversion ROMs, the pin data registers, the pin-data/scanning-data coincidence detecting AND circuits and others which increases substantially in proportion to the number of pins for measurement can be suppressed to a minimum, whereby a simple and inexpensive IC device test apparatus can be realized.

It is thought that the present invention and many of its attendant advantages will be understood from the forgoing description and it will be apparent that various changes may be made in the form, construction and arrangement thereof without departing from the spirit and scope of the invention or sacrificing all of its material advantages, the form hereinbefore described being merely a preferred or exemplary embodiment thereof.

Throughout the specification, various circuit elements have the following functions.

Start filp-flop 1B controls the clock for the scanning counter 1G. More specifically, this circuit enables the clock of 1G by the signal 21 from the CPU and the output from the oscillator and disables the clock of the 1G by the signal from the stop flip-flop 1D or the pinend flag 22 from the circuit 1F.

NOR circuit 1C is for the clock of the scanning counter 1G and sends out the clock by the output of the oscillator when the Q(NOT) function of the start flip-flop 1B is at "L" level.

Scanning counter 1G is used for access to the addresses of the BCD conversion ROM which stores scanning data. This counter 1G counts up each time the DC measuring apparatus 7 is connected to each pin of the DUT 9A-9D.

Stop flip-flop 1D of FIG. 3 functions to temporarily stop the scanning counter by the output of the oscillator when the coincidence detecting OR circuit 11 is at "H" level. The operation of flip-flop 1D of FIG. 1, cooperating with the DUT scanning circuit 5, is similar to that of OR circuit 11 of FIG. 3.

NOR circuit 1E is an NOR circuit for the stop flip-flop 1D and the pin-end flag 22 and functions to stop the scanning counter 1G temporarily when this NOR circuit output is a low or "L" level.

Pin-end flag flip-flop 1F functions to temporarily stop the scanning counter 1G and notifies to the CPU of the measurement termination of all pins by way of the pin-end flag 22. The pin-end flag 22 is set by the scanning counter 1G by way of (CA) carry signal.

ROM's 2, 2A-2D, have binary data ($A_0 \ldots A_6$) from the scanning counter 1G which correspond to the pins 1-32 under test.

Registers 3, 3A-3D, are latch registers for latching the data related to the pins 1-32 being sent from the CPU.

I claim:

1. A circuit for connecting sequentially a plurality of devices to be tested to measuring means, comprising:

circuit means for scanning said devices to be tested, said circuit means including a shift register which performs shift operation in response to a scan command signal, AND circuits each having one input to which an output of said shift register is applied and the other input to which a signal generated by the measuring means is applied and which indicates the presence or absence of the associated device to be tested, and a NOR circuit having inputs supplied from the outputs of said AND circuits, respectively;

NAND circuits each having one input to which the output of a corresponding one of said AND circuits is applied and the other input to which a pin card relay drive signal of a pin card is applied, said drive signal being generated by a binary coded decimal conversion ROM; and said binary coded decimal conversion ROM receiving an output of said NOR circuit which serves as an enable signal, said ROM having input addresses for receiving binary scanning data from a pin card scanning counter and converter the data into the decimal number corresponding to said pin card relay drive signal of said pin card;

wherein a relay incorporated in each of said pin cards is provided in association with said device to be tested and is driven by the output of the corresponding one of said NAND circuits so as to connect said measuring means to said pin card whose relay has applied thereto said relay drive signal.

2. A circuit according to claim 1, wherein said circuit is adapted to test sequentially a plurality of IC devices each of which serves as the device to be tested and each of which is equipped with a plurality of pins.

* * * * *